United States Patent
Sherlock et al.

(10) Patent No.: US 7,610,526 B2
(45) Date of Patent: Oct. 27, 2009

(54) ON-CHIP CIRCUITRY FOR BUS VALIDATION

(75) Inventors: Derek A. Sherlock, Fort Collins, CO (US); Jayen J. Desai, Wellington, CO (US); Chih-Jen Chen, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 873 days.

(21) Appl. No.: 11/041,821

(22) Filed: Jan. 24, 2005

(65) Prior Publication Data

US 2006/0168483 A1 Jul. 27, 2006

(51) Int. Cl.
*G01R 31/28* (2006.01)
*G06F 11/00* (2006.01)

(52) U.S. Cl. ............................ 714/724; 714/43; 714/56; 714/715; 714/738; 714/739

(58) Field of Classification Search ................... 714/43, 714/56, 715, 724, 738, 739
See application file for complete search history.

(56) References Cited

U.S. PATENT DOCUMENTS

| 5,228,042 A | 7/1993 | Gauthier et al. |
| 6,292,911 B1 * | 9/2001 | Swanson ..................... 714/715 |
| 6,609,221 B1 * | 8/2003 | Coyle et al. .................. 714/715 |
| 7,047,458 B2 * | 5/2006 | Nejedlo et al. ............... 714/715 |

FOREIGN PATENT DOCUMENTS

| JP | 5-322987 | 12/1993 |
| JP | 2000-88927 | 3/2000 |
| JP | 2000-181811 | 6/2000 |
| JP | 2000-194608 | 7/2000 |
| JP | 2001-85622 | 3/2001 |
| JP | 2001-267425 | 9/2001 |
| JP | 2003-173268 | 6/2003 |
| JP | 2003-173362 | 6/2003 |
| JP | 2004-94451 | 3/2004 |
| JP | 2004355435 A * | 12/2004 |
| WO | WO 00/73809 | 12/2000 |

OTHER PUBLICATIONS

Machine generated English translation of Sony Corp. JP 2000-88927, 14 pages, from the JPO website.*
Patent Office—China, Office Action dated Jul. 4, 2008, for Application No. 200610006876.2; pp. 1-10.
English translation of Japan Office Action dated Feb. 17, 2009, 4 pages.

* cited by examiner

*Primary Examiner*—John J Tabone, Jr.

(57) ABSTRACT

Systems, methodologies, media, and other embodiments associated with validating a bus are described. One exemplary system embodiment includes an integrated circuit operably connectable to a bus, the bus being connectable to an external device configured to drive one or more electrical signals onto the bus. The integrated circuit may comprise a first logic configured to receive a test sequence of electrical signals from the bus, a second logic configured to produce a check sequence of electrical signals related to the test sequence of electrical signals, and a compare logic operably connected to the first logic and the second logic. The compare logic may be configured to determine whether the bus is correctly transmitting data based, at least in part, on comparing the test sequence and the check sequence.

39 Claims, 10 Drawing Sheets

ON-CHIP CIRCUITRY FOR BUS VALIDATION

BACKGROUND

Debugging, validating, and/or exercising bus connections between and/or within integrated circuits has conventionally been difficult. While tools exist to determine whether there is a short circuit or an open circuit associated with bus paths, these tools have typically been static tools that are unsuitable for at-speed bus validation. While a short circuit is a short circuit at any speed, other electrical problems may only appear at strenuous speeds.

Some conventional tools associated with bus validation may employ conventional techniques like ECC (error checking and correcting) or parity checking to detect bus errors. Upon detecting an error, these tools may generate an HPMC (high priority machine check). While post-mortem crash dump data may be available, this data may be of limited value. For example, the data may not be associated with the cycle in which it was detected, may not identify events that lead up to the crash condition, may not facilitate triggering a temporally meaningful test event, and so on. Additionally, these tools are conventionally designed for run-time error detection, containment, and so on.

Conventional bus validation tools and techniques may rely on existing protocols associated with a bus. However, using such protocols makes it difficult, if possible at all, to generate interesting test patterns and to send them at known and/or predictable times in known and/or predictable sequences to facilitate coordination with other actions like monitoring an oscilloscope. Thus, these conventional tools may be held hostage to normal codes a chip/bus combination could produce. Additionally, these conventional tools may rely solely on techniques like varying parameters like voltage, temperature, and frequency to validate a bus. Once again, while this may provide some data, rigorous at-speed electrical validation is not achieved.

Many conventional bus validation tools require integrated circuits that are to be connected by the bus to be substantially complete before bus validation occurs. This produces a chicken and egg problem related to serial development. Thus, integrated circuit development, firmware development, and bus validation may be tightly coupled producing lockstep serial development scenarios.

Conventional tools may also require the physical attachment of electrical probes like those associated with an oscilloscope or protocol analyzer. With increasing chip densities and circuit densities, and correspondingly decreasing trace, path, and wire sizes, such physical attachments are becoming ever more difficult.

Additionally, conventional tools may not produce conditions rigorous enough to evaluate problems associated with inter-symbol interference (ISI) and the like. By way of illustration, the history of data driven on a bus line may influence timing of a future data symbol on that line. However, the effects may only appear at certain higher frequencies since these effects may depend, for example, on line geometry, line length, line resistance, line capacitance, and so on. By way of further illustration, conventional tools may not be able to create conditions like saturated bus traffic situations. Additionally, due to complex bus protocols, even if a condition can be created once, it may be difficult to reliably recreate the condition on demand to facilitate validation and diagnosis.

Some tools even facilitate providing small patterns to facilitate boundary scanning. For example, the IEEE 1149.1 standard describes a boundary scanning protocol provided by the Joint Test Action Group (JTAG). However, such boundary scanning is essentially a static (dc) test. Additionally, the serial architecture associated with this type of boundary scanning does not facilitate at-speed electrical validation.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
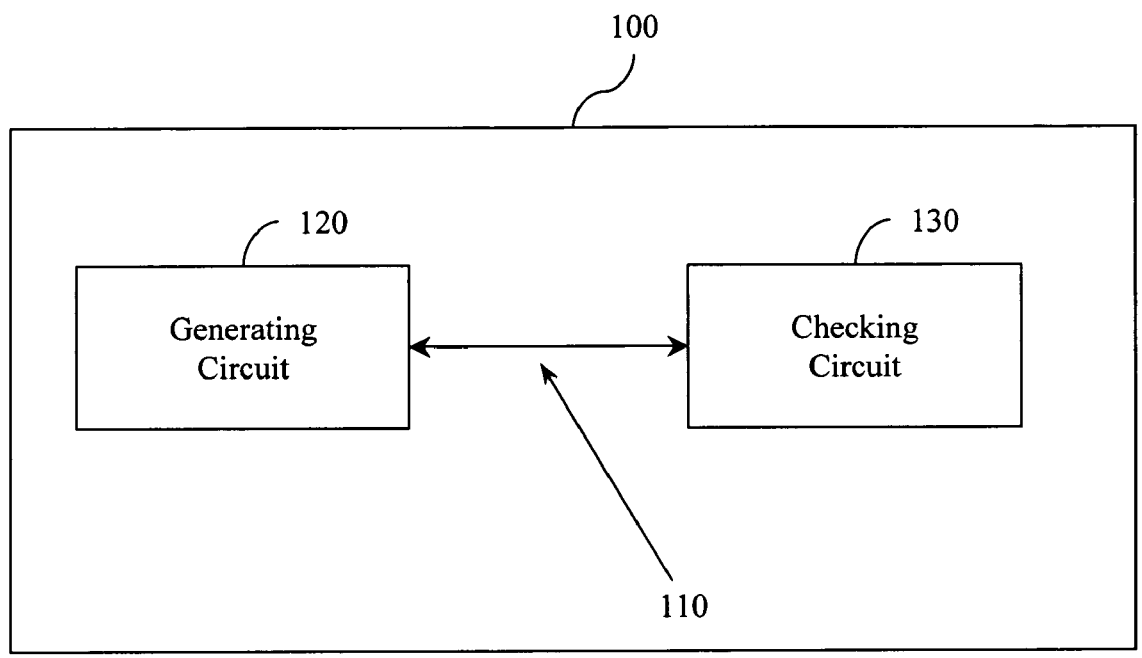
FIG. 1 illustrates an example on chip bus validation system.

Design for validation is an oft-neglected area that frequently succumbs to time and resource constraints. However, providing an automated on-chip tool that facilitates examining electrical properties of a bus, independent of the availability of a bus protocol, facilitates decoupling chip and bus development. Thus, example systems and methods described herein concern an automated tool(s) fabricated into an integrated circuit(s) that facilitates electrically validating a bus at-speed. Example systems and methods can be fabricated into a single integrated circuit and/or two or more integrated circuits and thus additional external hardware like an oscilloscope or protocol analyzer may not be required to electrically validate a bus. While external hardware may not be required, example systems and methods may facilitate providing a signal to external hardware to facilitate coordinating validation activities. Similarly, example systems and methods may facilitate acquiring data associated with bus validation to facilitate on-demand repeatability, external analysis, and so on. While "bus validation" is described herein, it is to be appreciated that some example systems and methods may have application in other areas like production testing.

Example systems and methods may facilitate producing electrical conditions that influence crosstalk between bus lines, interference between bus lines, current transients of a power supply associated with the bus, ground bounce in a chip associated with the bus, resonance in a bus line, saturated bus traffic conditions, attenuation, mistermination, PCB process drift, and so on. These conditions may cause effects that lead to observable digital data errors in data transmitted across a bus experiencing the conditions. Exercising these and/or other electrical properties facilitates exercising bus paths end-to-end, where a path may include elements like pads, traces, intervening buffer and register chips, and so on. These properties and paths may be exercised at a meaningful speed (e.g., actual bus clock speed) for a component without requiring circuits and/or integrated circuits connected by the bus being tested to be one hundred percent operational.

Example systems and methods may employ dedicated circuitry independent of the functionality of the rest of a system associated with the bus being validated or any single integrated circuit associated with the bus. The dedicated circuitry facilitates dynamically generating and/or checking interesting electrical patterns that may be driven onto a bus. These patterns may facilitate testing and/or characterizing external connections between integrated circuits in a system. Different possible patterns and/or sequences may be employed for different purposes. For example, a pseudorandom sequence may be employed to produce patterns that may stress inter symbol interference (ISI) conditions. Similarly, a walking ones or walking zeroes sequence may facilitate performing fastest edge tests. An alternating all ones and/or all zeroes sequence may facilitate testing maximum power, noise, RFI (radio frequency interference) and so on while an alternating all ones and/or all zeroes sequence with a user-selectable output always high or low facilitates testing ground bounce and/or crosstalk. An alternating AA or 55 sequence may facilitate testing maximum power. Other sequences may facilitate testing maximum current transients associated with a power supply, testing harmonics and resonances, and so on. While these test patterns facilitate exercising these properties, example systems and methods facilitate observing digital data errors attributable to problems with the exercised properties.

In different examples, these different patterns and/or sequences may be applied to different bus lines, sets of bus lines, and so on, to exercise different electrical characteristics. For example, given a bus with N lines, N being an integer, N-1 lines may be driven in a certain way with a certain sequence while an Nth line may be driven in a different way. This may facilitate identifying how the N-1 lines affect the Nth line and vice versa. Thus, culprit lines and/or victim lines may be identified, isolated, and characterized at-speed using built in circuitry independent of bus protocol.

In one example, the patterns and sequences may be generated using a pattern generator like a linear feedback shift register (LFSR). While an LFSR is described, it is to be appreciated that other programmable pattern generators may be employed. The on-chip pattern generators may automatically produce test patterns on the fly, which eliminates a need in conventional systems to provide (e.g., clock in) a pattern and/or to store a pattern in silico. This may facilitate reducing test pattern generation time while producing minimal impact on chip real estate consumption (e.g., only adding a pattern generator and a multiplexer).

In one example, the pattern generator(s) may generate and/or compare patterns in real time, synchronous with other clocks that may be present in a chip. Thus, the pattern generator(s) and associated validation tool(s) may run at the full speed intended for the bus. By using existing components in a chip, and by adding limited additional components like a pattern generator, a multiplexer, and a comparator, no additional delays may be introduced into a "normal" path employed by bus senders and bus receivers.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Bus" is used herein from an electrical-centric point of view. Thus "bus" refers to a collection of electrically similar paths that connect between one or more drivers and one or more receivers that share attributes like common topologies, clock methods, signaling methods, impedance, directionality, routing constraints, and so on. A "bus" may include paths that include active components that do not change a digital value on the path. A bus may connect components inside a single integrated circuit and/or may connect two different integrated circuits. A bus may have one or more lines, wires, traces, paths, and so on.

"Bus exercising", is also used herein from an electrical-centric point of view. "Bus exercising" refers to manipulating bus wires, traces, lines, paths, and the like to stress electrical and/or timing properties without regard to protocol rules that would apply to normal bus operation.

"Data store", as used herein, refers to a physical and/or logical entity that can store data. A data store may be, for example, a memory, a register, a latch, and so on. A data store may reside in one logical and/or physical entity and/or may be distributed between two or more logical and/or physical entities.

"Logic", as used herein, includes but is not limited to hardware, and firmware, and/or combinations of each to perform a function(s) or an action(s), and/or to cause a function or action from another logic and/or system. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, an operating system, a logic, or other entity. Logical and/or physical communication channels can be used to create an operable connection.

"Signal", as used herein, includes but is not limited to one or more electrical or optical signals, digital signals, or other means that can be received, transmitted and/or detected.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, or the like, refer to actions and processes of a computer system, logic, processor, or similar electronic device that manipulates and transforms data represented as physical (electronic) quantities.

FIG. 1 illustrates an example on chip bus validation system 100. System 100 may facilitate electrically validating and/or characterizing bus 110. System 100 may include, for example, a generating circuit 120 and a checking circuit 130. As described above, the logic, circuits, and so on associated with validating bus 100 may be fabricated into an integrated circuit(s) rather than being supplied by external devices like an oscilloscope, protocol analyzer, and the like.

System 100 facilitates enhanced validation capability for bus 110. The generating circuit 120 may produce a deterministic pattern (e.g., pseudorandom pattern) that is generated in circuit 120 and driven out to bus 110. The checking circuit 130 may produce a matching deterministic pattern that is generated in circuit 130 and then compared to signals received from bus 110. The signals received from bus 110 may be produced by the deterministic pattern generated by generating circuit 120 being driven onto bus 110. In one example, if the signals received over bus 110 do not match the deterministic pattern produced by checking circuit 130, then a "miscompare" state may exist.

To facilitate closely examining certain failures, in one example, generating circuit 120 may be configured to start a sequence at a desired point and/or to loop over a desired portion of a sequence. For example, if a certain portion of a sequence is known to produce a miscompare state in checking circuit 130, then generating circuit 120 may be configured to repeatedly drive that portion of the sequence onto bus 110.

In one example, generating circuit 120 and checking circuit 130 may be controlled, at least in part, by information provided through an interface (not illustrated). For example, a base scanning system may be employed to facilitate programming patterns to be generated, to start pattern generation, to terminate pattern generation, to interrogate results (e.g., read scan accessible registers), and the like.

While one bus 110 and one checking circuit 130 are illustrated in FIG. 1, it is to be appreciated that in some examples a generating circuit 120 may be connected to more than one bus and/or more than one checking circuit. Similarly, while a single generating circuit 120 is illustrated providing a signal to bus 110, it is to be appreciated that a bus may receive signals from one or more generating circuits.

Figure 2:
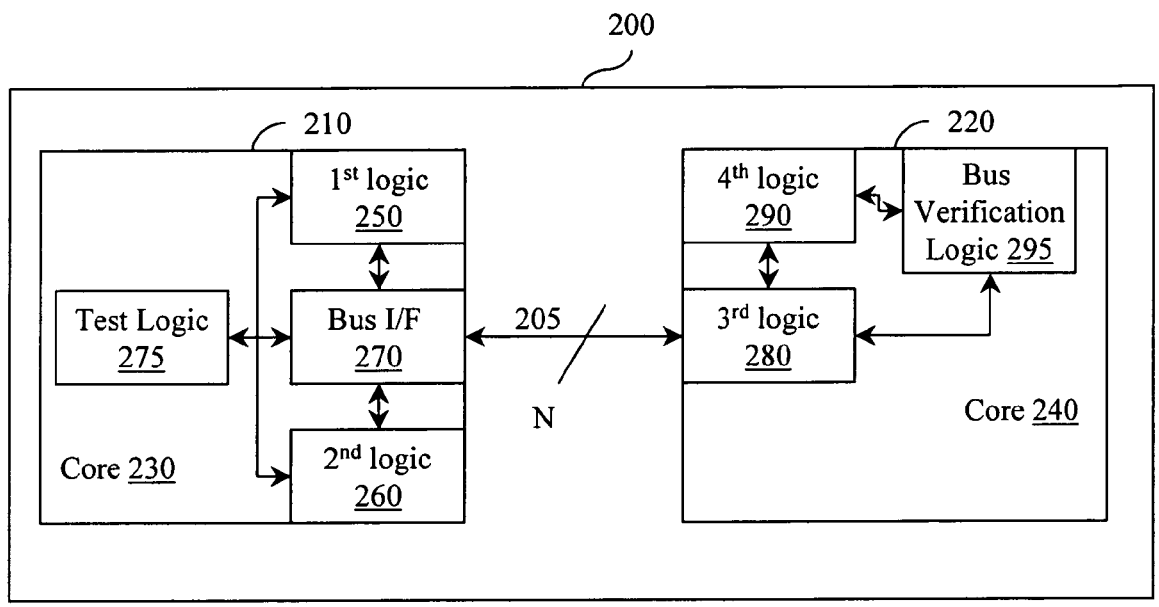
FIG. 2 illustrates another example on chip bus validation system.

FIG. 2 illustrates an example on chip bus validation system 200. System 200 may include a first circuit 210 that is operably connectable to a bus 205 to be electrically validated. System 200 may also include a second circuit 220 that is also operably connectable to bus 205. Circuit 210 may include a core 230 and circuit 220 may also include a core 240. In non-validation operation, signals transmitted between circuit 210 and circuit 220 may be provided by their respective cores and communicated across bus 205. When electrical bus validation is being performed by system 200, these cores may be disabled or otherwise have their signals blocked. For example, the cores may be held in a reset state while electrical bus validation is occurring. When electrical validation is not being performed, signals provided by the cores may be communicated without any additional delays attributable to elements of the test system 200. While bus 205 is illustrated connecting circuit 210 and circuit 220, it is to be appreciated that in one example an electrical path associated with bus 205 may be tested end-to-end. End-to-end testing may include testing an electrical path that includes transmission elements like lines, traces, pins, and additional elements that do not change a digital value like a pad, a trace, a buffer, a register and so on. It is to be appreciated that in some examples the first circuit 210 and the second circuit 220 may be fabricated into a single integrated circuit while in other examples circuit 210 and circuit 220 may be fabricated into separate integrated circuits.

Circuit 210 may include a first logic 250 that is configured to selectively produce a test sequence of electrical signals that may be driven onto bus 205. In one example, first logic 250 may be a linear feedback shift register (LFSR). The LFSR may be configured to produce a pseudorandom test sequence based, for example, on a cyclic redundancy check (CRC) polynomial method. While an LFSR is described, it is to be appreciated that other seeded pattern generators may be employed. In one example, the first logic 250 may be configured to produce the test sequence in real time, synchronous with one or more clock circuits providing a timing signal in first circuit 210.

In one example, first logic 250 may be configured with a reload seed loop feature. The reload seed loop feature facilitates having the first logic 250 repeatedly load a desired seed and to produce a sequence associated with that seed multiple times. This may facilitate grouping over a troublesome sequence for focused observation. In another example, first logic 250 may be configured to first run a long test with an original seed. Then, during the test, system 200 may acquire information about sections of a sequence that are interesting (e.g., cause a miscompare). Seeds for first logic 250 may be determined for these interesting sections and then first logic 250 may be controlled to repeatedly and/or selectively, on-demand, load these seeds and thus to repeatedly and/or selectively, on-demand, produce an interesting section of a sequence.

Circuit 210 may also include a second logic 260 that is configured to produce bus protocol signals that may be driven onto bus 205. These bus protocol signals may be generated and employed when circuit 210 is not operating in test mode.

Circuit 210 may also include a bus interface logic 270 that is operably connected to first logic 250 and second logic 260. However, system 200 may be validated in a protocol-independent mode, and thus test sequences and bus protocol signals will not be driven onto bus 205 at the same time. Thus, bus interface logic 270 may be controlled to select which of the test sequence and the bus protocol signals are driven onto bus 205. In one example, to facilitate realistic conditions, bus interface logic 270 may drive the test sequence onto bus 205 at a clock speed at or near that at which bus 205 is designed to operate in production. For example, if bus 205 is going to be clocked at 1 GHz, then bus interface logic 270 may drive the signal provided by first logic 250 onto bus 205 at or around 1 GHz. In one example, bus interface logic 270 may be controlled to establish a clock speed at which the test signal provided by first logic 250 is driven onto bus 205.

Circuit 210 may also include a test logic 275 that is operably connected to first logic 250, the second logic 260, and/or the bus interface logic 270. The test logic 275 may be configured to control circuit 210 to selectively control whether the bus protocol signals or the test sequence are driven onto bus 205. For example, the test logic 275 may be configured to control whether bus interface logic 270 drives test signals from first logic 250 or bus protocol signals from second logic 260 onto bus 205. In one example, test logic 275 may be configured to control bus interface logic 270 to selectively drive the test sequence provided by first logic 250 onto different selected bus lines associated with bus 205. By way of illustration, in a first validation, the bus interface logic 270 may be controlled to send the sequence over all the lines in bus 205. By way of further illustration, in a second validation, the bus interface logic 270 may be controlled to send the sequence over every other line in bus 205 or over all lines except one. While three possibilities are described, it is to be appreciated that bus interface logic 270 may be controlled to drive the sequence over other sets of lines.

As described above, system 200 may interact with a user through an interface. Thus, in one example, circuit 210 may be configured to receive a control signal. The control signal may determine, for example, a type of test sequence for first logic 250 to produce, a test sequence length, an initial test sequence recognition sequence, when sequence generating will begin, when sequence generating will end, a speed at which the test sequence will be driven onto bus 205 and so on. In one example, the interface may be controlled by Joint Test Action Group (JTAG) Test Access Port (TAP) instructions.

As mentioned above, system 200 may also include a second circuit 220 that is operably connectable to bus 205. The second circuit 220 may include a third logic 280 that is configured to receive from bus 205 a sequence of electrical signals produced when bus interface logic 270 drives the test sequence produced by first logic 250 onto bus 205. It is to be appreciated that in non-testing mode, third logic 280 may receive protocol signals and/or other signals (e.g., data) from bus 205.

Circuit 220 may also include a fourth logic 290 that is configured to produce a check sequence of electrical signals. To facilitate validating bus 205 by comparing sequences of electrical signals, the check sequence of electrical signals are related to the test sequence produced by the first logic 250. In one example, the first logic 250 and fourth logic 290 are identical components. Thus, in one example, the check sequence produced by fourth logic 290 is identical to the test sequence produced by first logic 250. Sequences produced by first logic 250 and fourth logic 290 may include, for example, a pseudorandom sequence, a walking ones sequence, a walking zeroes sequence, an alternating all ones sequence, an alternating all zeroes sequence, an alternating all ones sequence with a user selectable output always high, an alternating all ones sequence with a user selectable output always low, an alternating all zeroes sequence with a user selectable output always low, an alternating all zeroes sequence with a user selectable output always high, an alternating AA sequence, an alternating 55 sequence, and so on. As described earlier, these different sequences may be employed alone, and/or in combination, to exercise various electrical properties of bus 205. Problems with the bus may then be detected through mismatched data.

Since first logic 250 and fourth logic 290 are producing sequences of electrical signals, system 200 may be configured to facilitate synchronizing the two sequences to facilitate comparing the two sequences. Synchronization methods may include, for example, configuring third logic 280 to look for a specific first transition on a signal received from bus 205, configuring third logic 280 to look for a specific initial sequence in signals received from bus 205, adding an extra line to bus 205 to carry a synchronization signal(s), assigning an existing line in bus 205 to carry a synchronization signal (s), and so on. This synchronization facilitates detecting mismatched data.

Circuit 220 may also include a bus verification logic 295 that is operably connected to third logic 280 and fourth logic 290. Bus verification logic 295 may be configured to determine whether bus 205 is correctly transmitting digital data. When deciding whether the bus is operating as desired (e.g., correctly transmitting digital data), bus verification logic 295 may compare the sequence received by third logic 280 and the check sequence produced by fourth logic 290. In one example, if the signals do not match, then system 200 may report a "bus failed test" condition while if all the signals in a complete sequence match then system 200 may report a "bus passed test" condition. In different examples and in different tests, observed digital data errors may be attributable to problems with properties like ground bounce, crosstalk, interference, current transients, line resonance, saturated bus traffic conditions, attenuation, mistermination, PCB process drift, and so on.

Like circuit 210, circuit 220 may also interact with a user through an interface. Thus, circuit 220 may be configured to receive a control signal. The control signal may determine, for example, what type of check sequence fourth logic 290 will produce, how long the check sequence should be, an initial test sequence recognition sequence that third logic 280 will look for to indicate that sequence comparison should begin, a bus line(s) for which testing is to be performed, and so on. Additionally, the control signal may determine whether an error mask is to be employed by bus verification logic 295. If the error mask is to be employed, then only certain user-selectable error types (e.g., crosstalk) will be monitored. The control signal may also determine what type, if any, of miscompare data to acquire and whether a signal will be provided to an external device upon a miscompare. Miscompare data may be acquired before an error is detected (e.g., pre-miscompare data), after an error is detected (e.g., post-miscompare data), and so on. In one example, the interface may be controlled by Joint Test Action Group (JTAG) Test Access Port (TAP) instructions.

Figure 3:
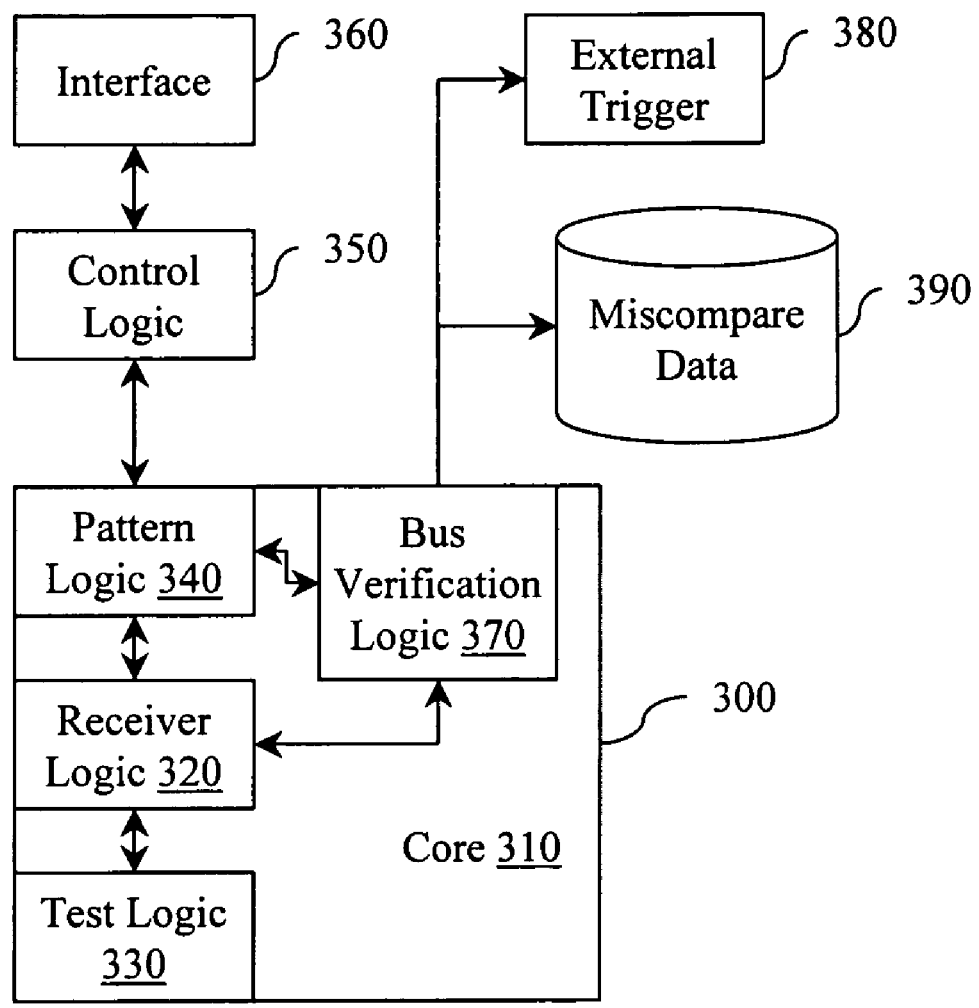
FIG. 3 illustrates an integrated circuit configured with a portion of an on chip bus validation system.

FIG. 3 illustrates an integrated circuit 300 that is configured with a portion of an on chip bus validation system. While circuits 210 (FIG. 2) and 220 (FIG. 2) contained some of these elements, it is to be appreciated that integrated circuits, whether generating circuits 120 (FIG. 1) and/or checking circuits 130 (FIG. 1) in on chip bus validation systems may be configured with one or more elements described in FIG. 3.

Integrated circuit 300 may include a core 310 that, in non-testing situations, provides signals that may be driven onto a bus or that receives signals from a bus. Integrated circuit 300 may also include a receiver logic 320 that is configured to receive from a bus a sequence of electrical signals produced when signals are driven onto a bus to which integrated circuit 300 is connected. It is to be appreciated that in non-testing mode, receiver logic 320 may receive protocol signals and/or other signals (e.g., data) from the bus while in a testing mode, receiver logic 320 may receive test sequence signals. Thus, integrated circuit 300 may include a test logic 330 that facilitates controlling whether integrated circuit 300 is operated in a bus test mode or a normal mode.

Integrated circuit 300 may also include a pattern logic 340 that is configured to produce a check sequence of electrical signals. The check sequence of electrical signals may be related to a test sequence produced by another integrated circuit in an on chip electrical bus testing/validation system. Additionally, integrated circuit 300 may include a bus verification logic 370 that is operably connected to receiver logic 320 and pattern logic 340. Bus verification logic 370 may be configured to determine whether a bus attached to integrated circuit 300 is operating within a pre-defined electrical standard. When deciding whether the bus is operating as desired (e.g., within a pre-defined electrical standard), bus verification logic 370 may compare the sequence received by receiver logic 320 and the check sequence produced by pattern logic 340.

In one example, bus verification logic 370 may be configured to selectively produce an external trigger 380 upon detecting a digital data error (e.g., data mismatch). The external trigger 380 may be, for example, an electrical signal and may be provided, for example, to an external device like an oscilloscope, a protocol analyzer, and so on. Thus, integrated circuit 300 facilitates mitigating issues associated with conventional tools concerning the ability to produce a temporally meaningful indication of a bus failure. External trigger 380 may facilitate, for example, determining which portion of a sequence caused a bus electrical characteristic to fall outside a desired range which lead to an observable event like a data mismatch.

In another example, bus verification logic 370 may be configured to selectively produce a miscompare data 390. The miscompare data 390 may be configured, for example, to record information concerning bus operation parameters. In particular, the miscompare data 390 may record information about when a miscompare occurred. Thus, the miscompare data may include, for example, a seed value employed by the pattern logic 340, an offset from the beginning of the check test sequence at which a miscompare occurred, a bus line on which a miscompare occurred, and so on. While miscompare data 390 is illustrated outside integrated circuit 300, it is to be appreciated that the miscompare data 390 may be stored in integrated circuit 300 in a data store like a scan accessible register (not illustrated).

Miscompare data 390 may take forms like pre-miscompare data, post-miscompare data and so on. Pre-miscompare data may include signals received by third logic 320 before a miscompare occurs. Then, when the miscompare occurs, the pre-miscompare data may be available to facilitate understanding what happened leading up to the miscompare. Conversely, post-miscompare data may include signals received by third logic 320 after a miscompare occurs.

In one example, bus verification logic 370 may include a mask register (not illustrated) that facilitates selectively generating external trigger 380, selectively collecting miscompare data 390, and so on. The mask register may be configured to control bus verification logic 370 to only report certain types of miscompares associated with certain sets of bus wires. For example, previous testing may have revealed that a bus has a problem with a first wire. Subsequent testing may be undertaken to determine whether a second set of pins have problems. Thus, while this subsequent testing is underway, the mask register may be configured to prevent bus verification logic 370 from generating a miscompare based on signals received on the first wire. In another example, bus verification logic 370 may include a checksum register (not illustrated) that facilitates accumulating information about errors (e.g., miscompares) over a period of time. This may facilitate longer term testing whose goal is understanding what has happened over a span of time rather than at any particular point in time. While a mask register and a checksum register are described, it is to be appreciated that masking and checksum functions may be implemented in other circuitry, logics, gates, and so on.

Figure 4:
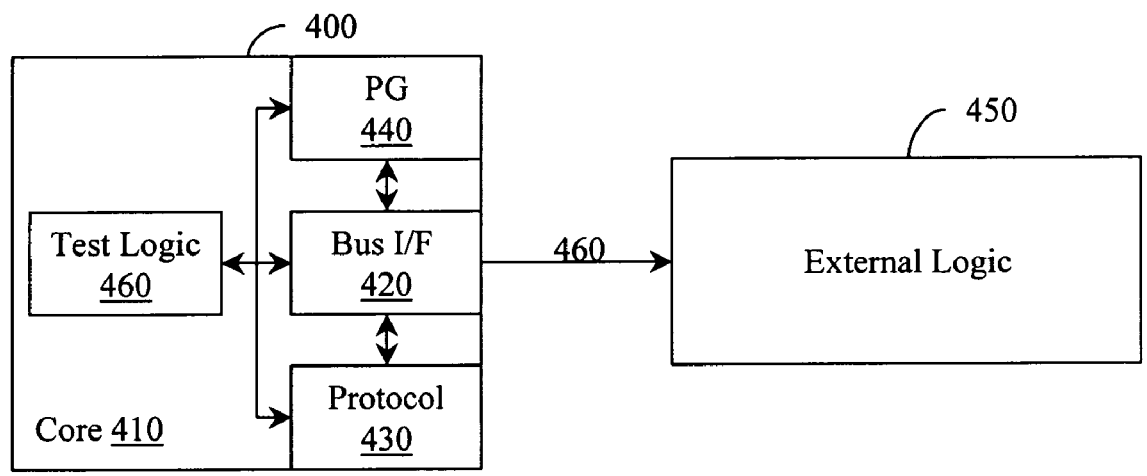
FIG. 4 illustrates an integrated circuit configured with an example on chip bus validation system interacting with an external device.

FIG. 4 illustrates an integrated circuit 400 configured with an on chip bus validation system interacting with an external device 450. While FIG. 1 and FIG. 2 illustrated systems with two circuits connected by a bus, some busses may be "open-ended", that is, designed to facilitate connecting plug-in cards, add-in chips, and so on to a computer component or system. Thus, FIG. 4 illustrates an integrated circuit 400 operably connectable to a bus 460 to be electrically validated. Bus 460 is in turn connectable to an external device 450. The external device 450 may be configured to receive electrical signals from bus 460.

Integrated circuit 400 may include a first logic (e.g., pattern generating logic 440) that is configured to selectively produce a test sequence of electrical signals that may be driven onto bus 460. Integrated circuit 400 may also include a second logic (e.g., protocol logic 430) that is configured to produce bus protocol signals that may also be driven onto bus 460. To facilitate driving either the test sequence or the bus protocol signals onto bus 460, integrated circuit 400 may include a bus interface logic 420. Integrated circuit 400 may also include a test logic 460 that is operably connected to the first logic 440, the second logic 430, and/or the bus interface logic 420. The test logic 460 may be configured to control the first integrated circuit 400 to select which of the bus protocol signals and the test sequence of electrical signals are driven onto bus 460 and thus received by external test device 450. In one example, the external device 450 may be configured to receive signals from bus 460 using a data capture DIMM (dual in-line memory module). The external device 450 may be, for example, an oscilloscope, a protocol analyzer, a computer, and so on.

Figure 5:
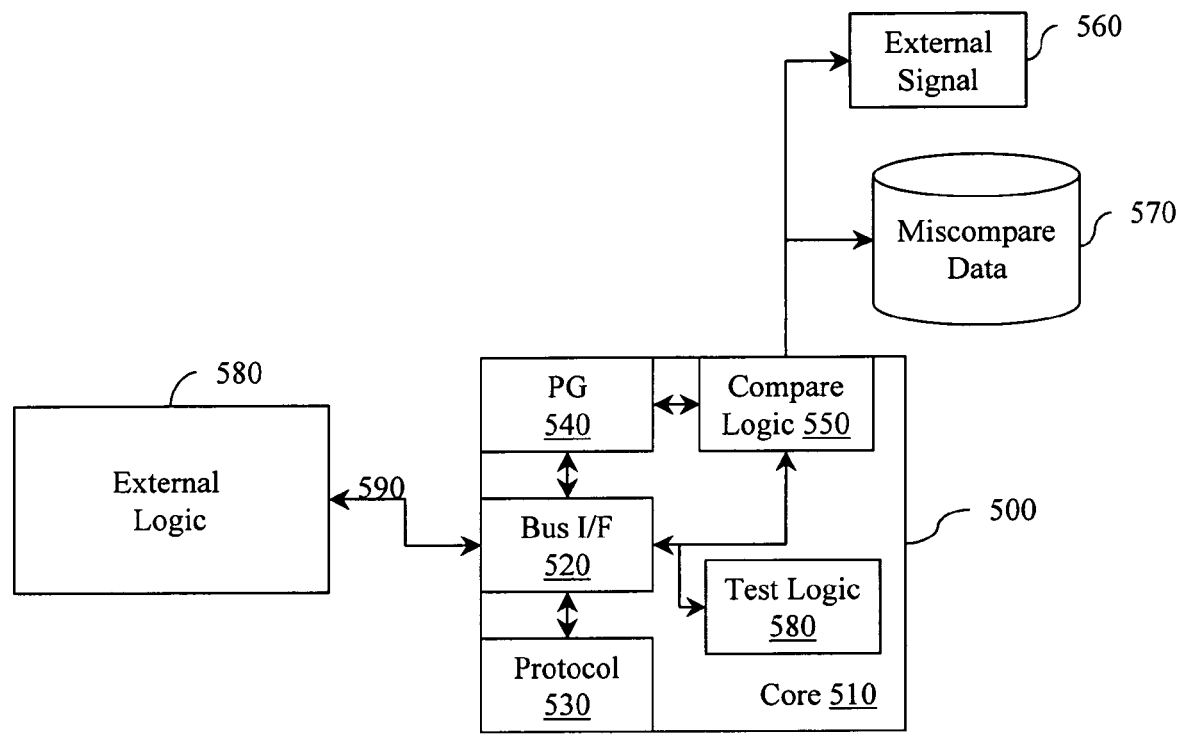
FIG. 5 illustrates an integrated circuit configured with an example on chip bus validation system interacting with another external device.

While FIG. 4 illustrated an integrated circuit providing bus validating signals to an external device, FIG. 5 illustrates an integrated circuit 500 receiving signals from an external device 580. Integrated circuit 500 may be configured with elements and logics like those described in association with FIG. 3. For example, integrated circuit 500 may include a core 510, a bus interface logic 520 for receiving signals, a protocol logic 530 for generating/understanding protocol signals, a pattern generating logic 540 for producing a check sequence, a compare logic 550 for doing bus verification tasks, and a test logic 580 for controlling whether integrated circuit 500 runs in a testing or non-testing mode. Similarly, integrated circuit 500 may be configured to produce an external signal 560, miscompare data 570, and so on.

As illustrated, the integrated circuit 500 is operably connectable to a bus 590 that is in turn connectable to an external device 580. The external device 580 may be configured to drive electrical signals onto bus 590. Thus, the compare logic 550 may be operably connected to bus interface logic 520 and pattern generating logic 540 to facilitate access to both received signals and a generated check sequence. In addition, compare logic 550 may be configured to determine whether bus 590 is correctly transmitting digital data. The determination may depend, at least in part, on comparing signals received from external device 580 and the check sequence generated by pattern generating logic 540.

Figure 6:
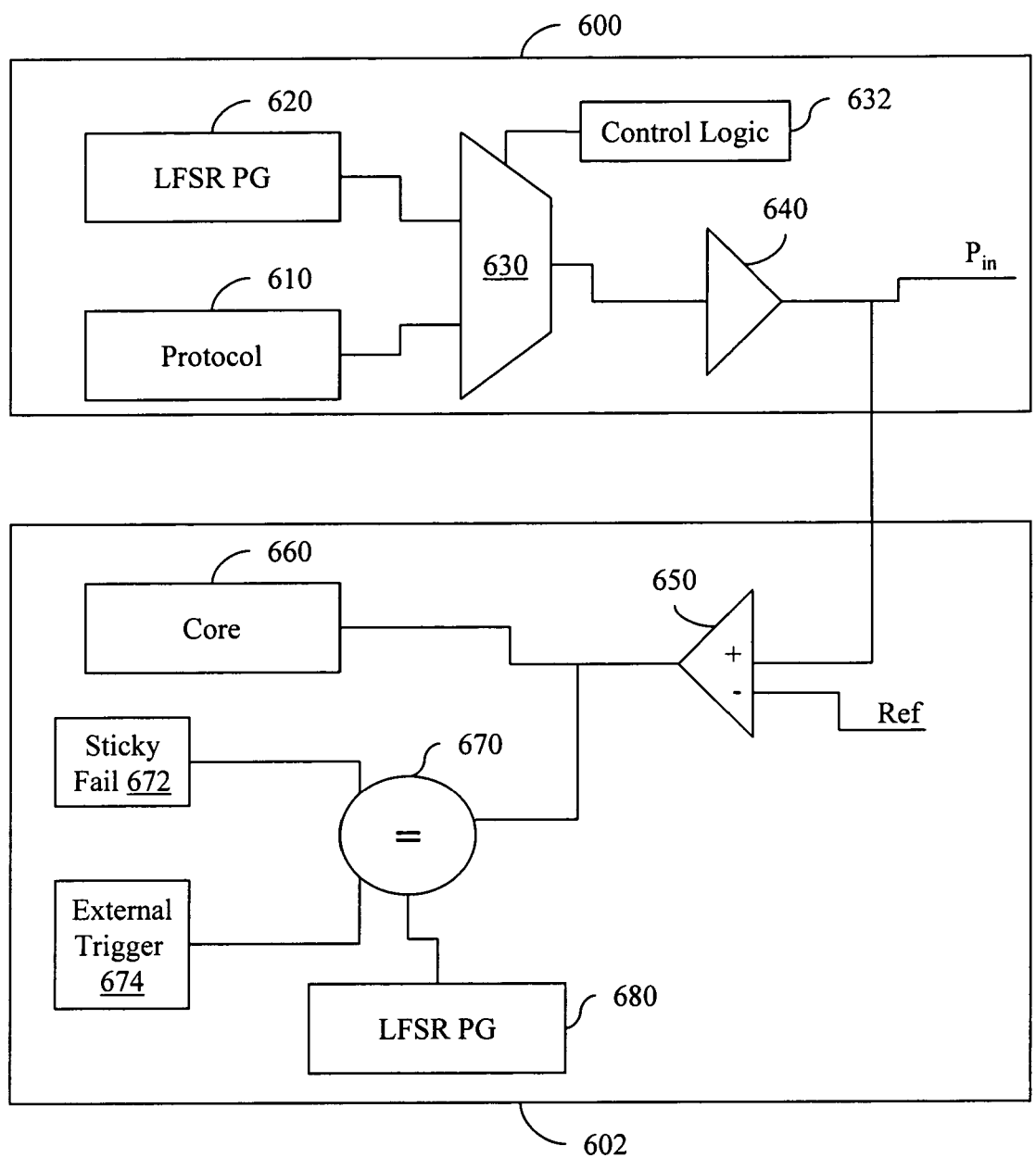
FIG. 6 is a simplified circuit diagram of a portion of an on chip bus validation system.

FIG. 6 is a simplified circuit diagram of a portion of an on chip bus validation system. The system includes a first circuit portion 600 that is connected by a bus to a second circuit portion 602. The first circuit portion 600 includes a first sub-circuit 620 that is configured to produce a first set of electrical signals. The first set of electrical signals may be associated with validating the bus. These signals may be, for example, a test sequence of electrical signals to be driven onto the bus. The fist sub-circuit 620 may be, for example, an LFSR pattern generator configured to accept a programmable seed and produce a pseudo-random number sequence. In one example, first circuit portion 600 may be fabricated into an integrated circuit.

The first circuit portion 600 may also include a second sub-circuit 610 that is configured to produce bus protocol signals that may also be driven onto the bus. Since it may be desired to validate the bus in a protocol-independent manner, the first circuit portion 600 may include a multiplexer 630 that can be controlled by a control logic 632 to selectively provide either the first set of electrical signals (e.g., the test sequence) or the bus protocol signals to downstream circuitry (e.g., driver 640) to be driven onto the bus.

As described above, a second circuit portion 602 may also be connected to the bus and thus to first circuit portion 600. Second circuit portion 602 may include a fourth sub-circuit (e.g., receiver 650) that is configured to receive electrical signals from the bus. These signals may include, for example, signals produced in response to the first set of electrical signals being driven onto the bus. Receiver 650 may provide the received signals to a core 660 and may also provide the signals to a comparator 670. The comparator 670 may also receive signals from a fifth sub-circuit like LFSR pattern generator 680 that is configured to produce a second set of electrical signals identical to the first set of electrical signals produced by LFSR 620. With both the signals received from the bus and the signals produced by pattern generator 680 available, comparator 670 may be configured to determine whether the bus is correctly transmitting digital data. The determination may be based, at least in part, on comparing the electrical signals received from the bus and the electrical signals produced by pattern generator 680.

In one example, comparator 670 may be connected to a sticky fail logic 672 and an external trigger logic 674. Thus, second circuit portion 602 may be configured to selectively produce, upon determining that the bus is not correctly transmitting digital data, an external trigger, and to selectively record information concerning the electrical signals received from the bus, the electrical signals produced by the pattern generator 680, and so on. The sticky fail logic 672 may include, for example, scan accessible registers that facilitate acquiring data associated with a miscompare. This data may include, for example, data concerning how many clock cycles since the start of a sequence a miscompare occurred, what data was expected at comparator 670, what data was received at comparator 670, which bus line produced a miscompare, and so on. The sticky fail logic 672 may pre-store arriving data and, when a miscompare occurs, stop storing data so data leading up to a miscompare is available.

Like first circuit portion 600, second circuit portion 602 may be fabricated into an integrated circuit. In one example, first circuit portion 600, second circuit portion 602 and the bus connecting them may be fabricated into a single integrated circuit. In another example, first circuit portion 600 and second circuit portion 602 may be fabricated into two separate integrated circuits connected by a bus. While a single second portion 602 is illustrated, it is to be appreciated that in some examples first circuit portion 602 may be connected to one or more second portions 602.

Figure 7:
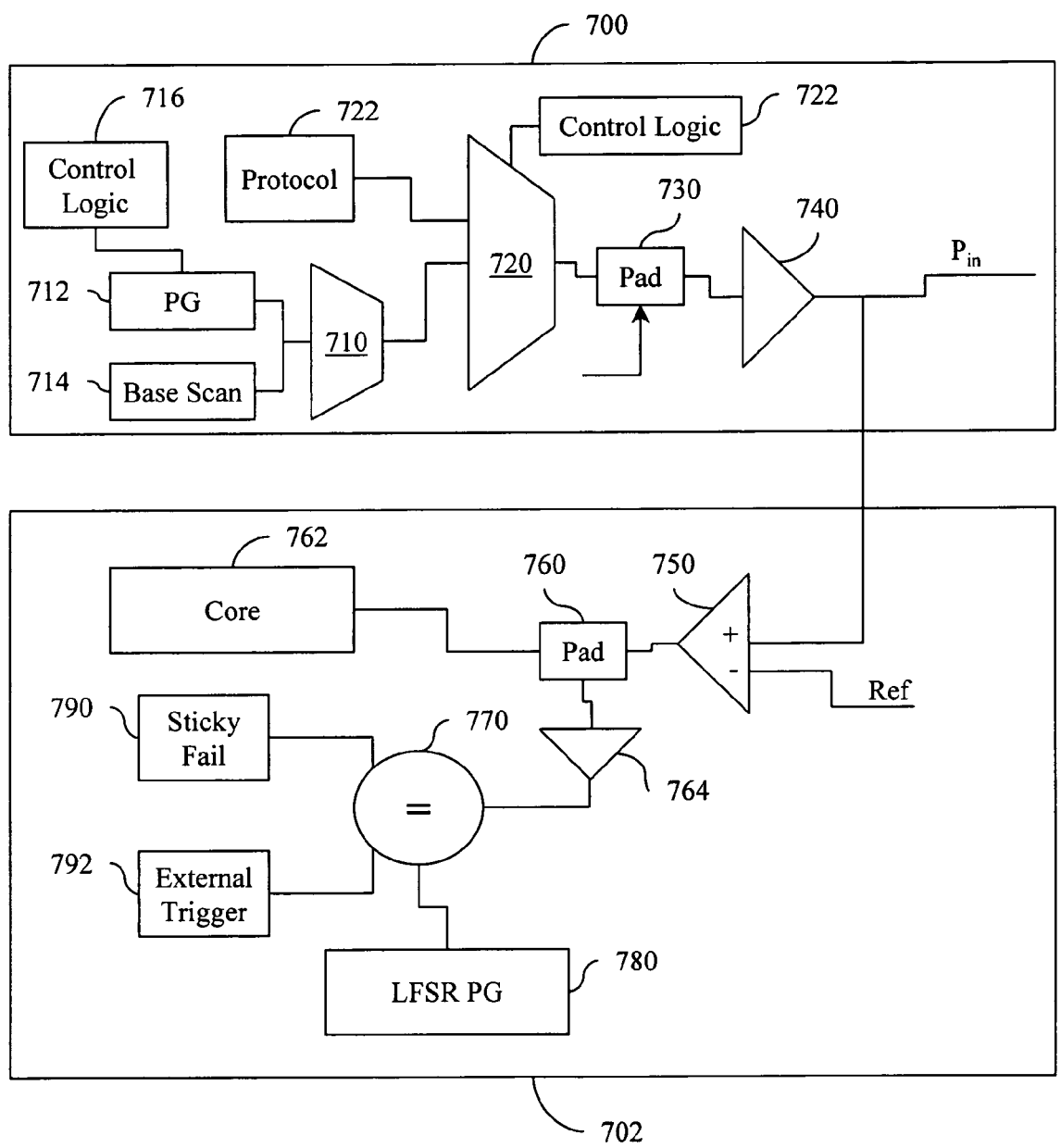
FIG. 7 is a simplified circuit diagram of a portion of an on chip bus validation system.

FIG. 7 is a simplified circuit diagram of a portion of an on chip bus validation system fabricated into an integrated circuit 700 that is also configured with a base scanning logic 714. As described above, example systems may be controlled, at least in part, by data provided to the systems from an interface. One example interface is a base scanning interface associated with a JTAG application. The interface may be controlled, for example, by JTAG Test Access Port (TAP) instructions. In one example, as illustrated in FIG. 7, adding bus validation components like a control logic 716 and a pattern generator 712 may not add delays to a non-testing path through multiplexer 720, pad 730, and driver 740. Likewise, in integrated circuit 702, the addition of bus validation components like comparator 770, sticky fail logic 790, and external trigger logic 792 does not add delays to a non-testing path from receiver 750, through pad 760 to core 762.

Figure 8:
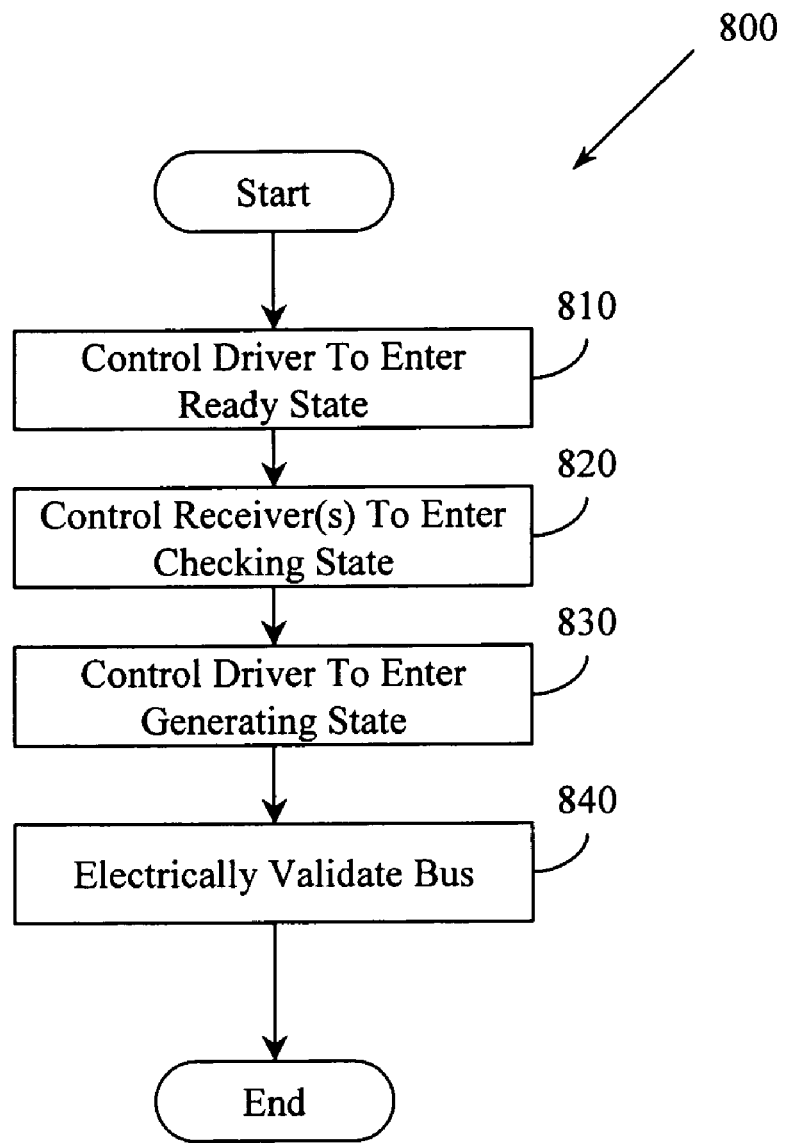
FIG. 8 illustrates an example method associated with an on chip bus validation system.

Example methods may be better appreciated with reference to the flow diagram of FIG. 8. While for purposes of simplicity of explanation, the illustrated methodology is shown and described as a series of blocks, it is to be appreciated that the methodology is not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

In the flow diagrams, blocks denote "processing blocks" that may be implemented with logic. The processing blocks may represent a method step and/or an apparatus element for performing the method step. A flow diagram illustrates functional information one skilled in the art may employ to develop logic to perform the illustrated processing. It will be appreciated that electronic applications may involve dynamic and flexible processes so that in some examples the illustrated blocks may be performed in other sequences that are different from those shown and/or that blocks may be combined or separated into multiple components.

FIG. 8 illustrates an example method 800 of operating a bus validation system. Method 800 may include, at 810, controlling a driver to enter a ready state. In one example, the driver may be implemented in a circuit operably connected to a bus to be examined by the bus validation system. In one example, controlling the driver to enter the ready state includes controlling the driver to drive a benign set of electrical values (e.g., all zeroes, all ones) onto the bus.

Method 800 may also include, at 820, controlling a receiver to enter a checking state. Like the driver, the receiver may be implemented in a circuit that is operably connected to the bus. The receiver may be configured to generate a first sequence of electrical signals useful for comparing to testing signals received across the bus. In one example, controlling the receiver to enter the checking state may include providing data that controls the length of the sequence produced by the receiver, the type of sequence produced by the receiver, the type of external trigger for which the receiver should look to synchronize sequence checking, a type of error data to be collected by the receiver, a seed value for the receiver pattern generator that determines, at least in part, the sequence produced by the receiver, and a trigger mask that determines, at least in part, what type of bus-operation criteria are examined.

Method 800 may also include, at 830, controlling the driver to enter a generating state. In the generating state, the driver may produce a second sequence of electrical signals that are driven onto the bus. This second sequence of electrical signals may be useful for electrically validating and/or characterizing the bus. In one example, controlling the driver to enter the generating state may include providing data that controls, for example, the length of sequence produced by the driver, the type of sequence produced by the driver, a speed at which signals should be driven onto the bus, and a seed value that determines, at least in part, the sequence of electrical signals produced by the driver.

Method 800 may also include, at 840, electrically validating the bus. Electrically validating the bus may include, for example, determining whether the bus is operating correctly based, at least in part, on comparing the sequence of signals produced by the receiver to electrical signals received by the receiver when the sequence of test signals produced by the driver are driven onto the bus.

After determining whether the bus is operating correctly, method 800 may include reporting a success state (e.g., bus passed) or reporting a failure state (e.g., bus failed). If a failure state exists, then method 800 may include handling the failure by, for example, selectively recording data like a seed associated with a sequence being generated, an offset from the beginning of a sequence being generated, data associated with electrical signals in a sequence being generated, and the like.

Figure 9:
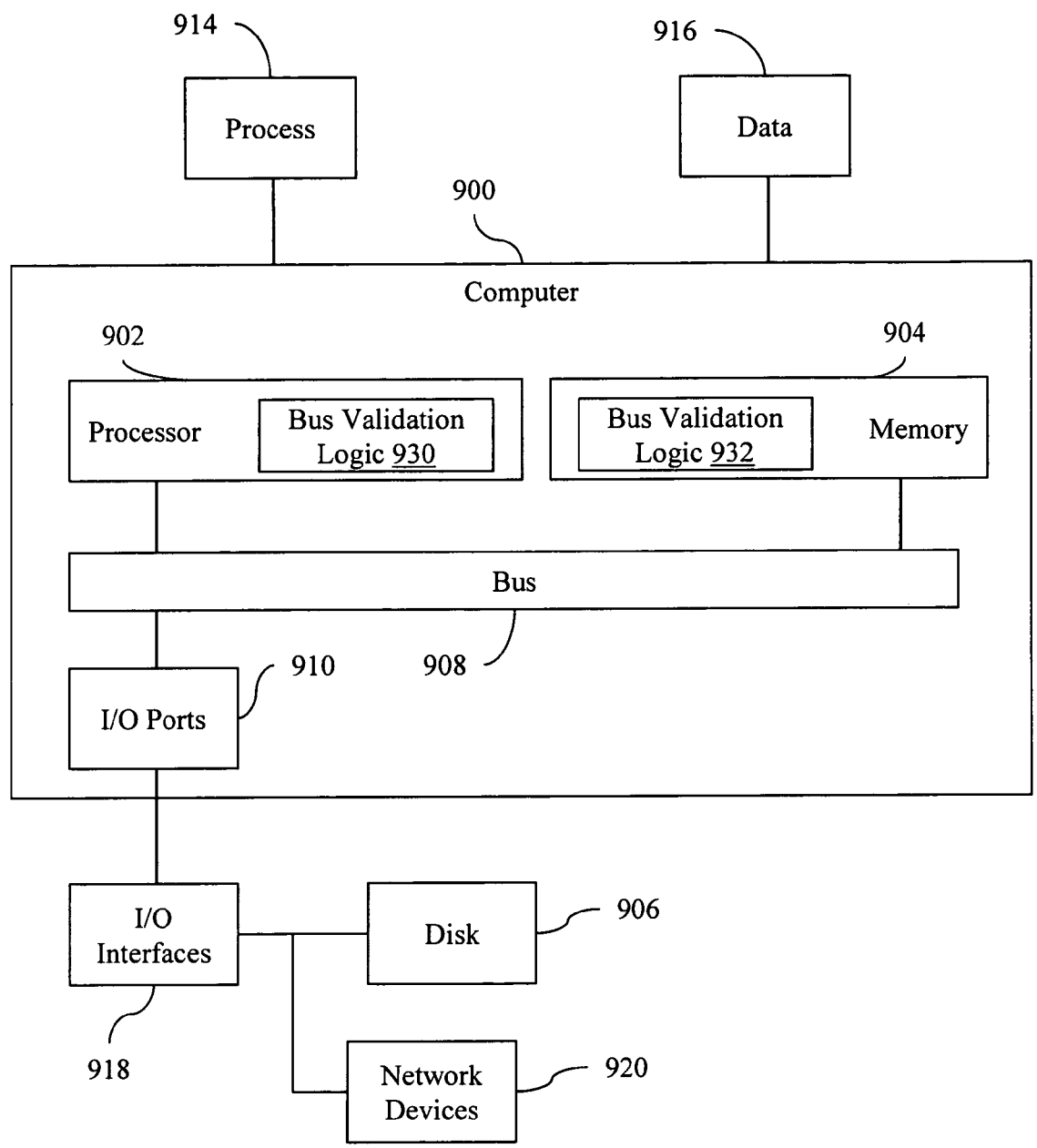
FIG. 9 illustrates an example computing environment in which example systems and methods illustrated herein can operate.

FIG. 9 illustrates a computer 900 that includes a processor 902, a memory 904, and input/output ports 910 operably connected by a bus 908. In one example, the computer 900 may include bus validation logics 930 and 932 that are configured to facilitate electrical bus validation. Bus validation logics 930 and 932, whether implemented in computer 900 as hardware, firmware, and/or a combination thereof may provide means for producing a programmatically definable first bus test pattern, means for placing the first bus test pattern on a bus, means for receiving electrical signals associated with the first bus test pattern being placed on the bus, means for generating a programmatically definable second bus test pattern, and means for determining whether the electrical signals reveal a data miscompare that may be attributable to an undesired electrical characteristic in the bus. It is to be appreciated that all the means are fabricated into an integrated circuit(s) operably connected by the bus.

The processor 902 can be a variety of various processors including dual microprocessor and other multi-processor architectures. The memory 904 can include volatile memory and/or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 906 may be operably connected to the computer 900 via, for example, an input/output interface (e.g., card, device) 918 and an input/output port 910. The disk 906 can include, but is not limited to, devices like a magnetic disk drive, a solid state disk drive, a floppy disk drive, a tape drive, a Zip drive, a flash memory card, and/or a memory stick. Furthermore, the disk 906 can include optical drives like a CD-ROM, a CD recordable drive (CD-R drive), a CD rewriteable drive (CD-RW drive), and/or a digital video ROM drive (DVD ROM). The memory 904 can store processes 914 and/or data 916, for example. The disk 906 and/or memory 904 can store an operating system that controls and allocates resources of the computer 900.

The bus 908 can be a single internal bus interconnect architecture and/or other bus or mesh architectures. While a single bus is illustrated, it is to be appreciated that computer 900 may communicate with various devices, logics, and peripherals using other busses that are not illustrated (e.g., PCIE, SATA, Infiniband, 1394, USB, Ethernet). The bus 908 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 900 may interact with input/output devices via i/o interfaces 918 and input/output ports 910. Input/output devices can include, but are not limited to, a keyboard, a microphone, a pointing and selection device, cameras, video cards, displays, disk 906, network devices 920, and the like. The input/output ports 910 can include but are not limited to, serial ports, parallel ports, and USB ports.

The computer 900 can operate in a network environment and thus may be connected to network devices 920 via the i/o interfaces 918, and/or the i/o ports 910. Through the network devices 920, the computer 900 may interact with a network. Through the network, the computer 900 may be logically connected to remote computers. The networks with which the computer 900 may interact include, but are not limited to, a local area network (LAN), a wide area network (WAN), and other networks. The network devices 920 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 920 can connect to WAN technologies including, but not limited to, point to point links, circuit switching networks like integrated services digital networks (ISDN), packet switching networks, and digital subscriber lines (DSL). While individual network types are described, it is to be appreciated that communications via, over, and/or through a network may include combinations and mixtures of communications.

Figure 10:
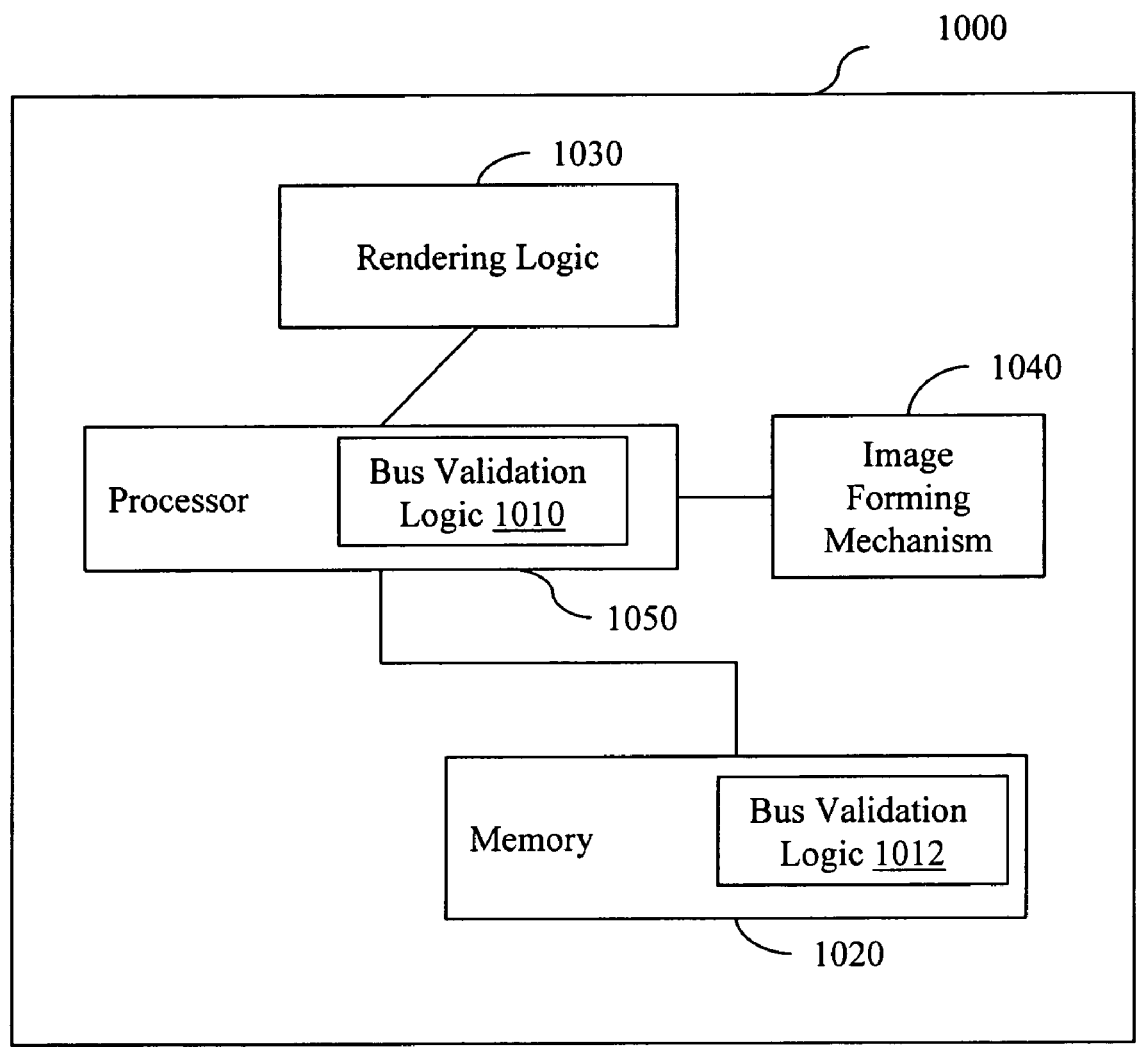
FIG. 10 illustrates an example image forming device in which example systems and methods illustrated herein can operate.

FIG. 10 illustrates an example image forming device 1000 that includes bus validation logics 1010 and 1012 similar to the example systems described herein. The bus validation logics may be configured to perform executable methods like those described herein. While two logics 1010 and 1012 are illustrated, it is to be appreciated that image forming device 1000 may include more than one bus validation logic.

The image forming device 1000 may receive print data to be rendered. Thus, image forming device 1000 may also include a memory 1020 configured to store print data or to be used more generally for image processing. The image forming device 1000 may also include a rendering logic 1030 configured to generate a printer-ready image from print data. Rendering varies based on the format of the data involved and the type of imaging device. In general, the rendering logic 1030 converts high-level data into a graphical image for display or printing (e.g., the print-ready image). For example, one form is ray-tracing that takes a mathematical model of a three-dimensional object or scene and converts it into a bitmap image. Another example is the process of converting HTML into an image for display/printing. It is to be appreciated that the image forming device 1000 may receive printer-ready data that does not need to be rendered and thus the rendering logic 1030 may not appear in some image forming devices.

The image forming device 1000 may also include an image forming mechanism 1040 configured to generate an image onto print media from the print-ready image. The image forming mechanism 1040 may vary based on the type of the imaging device 1000 and may include a laser imaging mechanism, other toner-based imaging mechanisms, an ink jet mechanism, digital imaging mechanism, or other imaging reproduction engine. A processor 1050 may be included that is implemented with logic to control the operation of the image-forming device 1000. In one example, the processor 1050 includes logic that is capable of executing Java instructions. Other components of the image forming device 1000 are not described herein but may include media handling and storage mechanisms, sensors, controllers, and other components involved in the imaging process.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
a first circuit operably connected to a bus to be electrically validated, the first circuit comprising:
   a first logic configured to selectively produce a test sequence of electrical signals that may be driven onto the bus;
   a second logic configured to produce one or more bus protocol signals that may be driven onto the bus;
   a bus interface logic operably connected to the first logic and the second logic, the bus interface logic being configured to drive the test sequence and the bus protocol signals onto the bus; and
   a test logic operably connected to one or more of the first logic, the second logic, and the bus interface logic, the test logic being configured to control the first circuit to select which of, the bus protocol signals, and the test sequence are driven onto the bus; and
a second circuit operably connected to the bus, the second circuit comprising:
   a third logic configured to receive from the bus a received sequence of electrical sequences produced by the bus interface logic driving the test sequence onto the bus;
   a fourth logic configured to produce a check sequence of electrical signals related to the test sequence; and
   a bus verification logic operably connected to the third logic and the fourth logic, the bus verification logic being configured to determine whether the bus is correctly transmitting digital data based, at least in part, on comparing the received sequence and the check sequence, and to produce a miscompare data configured to record information concerning parameters associated with determining that the bus is not correctly transmitting digital data, where the miscompare data comprises a bus line on which a miscompare occurred, where the miscompare data comprises a seed value employed by the fourth logic.

2. The system of claim 1, the bus verification logic being configured to selectively produce an external trigger upon determining that the bus is not correctly transmitting digital data.

3. The system of claim 1, the miscompare data also comprising an offset from the beginning of the check sequence at which a miscompare occurred.

4. The system of claim 1, where the test sequence is driven onto the bus at a clock speed at which the bus is designed to operate in production.

5. The system of claim 1, where an electrical path associated with the bus is tested from end-to-end, where the electrical path may include one or more of, a pad, a trace, a buffer, and a register.

6. The system of claim 1, the test sequence being one or more of, a pseudorandom sequence, a walking ones sequence, a walking zeroes sequence, an alternating all ones sequence, an alternating all zeroes sequence, an alternating all ones sequence with a user selectable output always high, an alternating all ones sequence with a user selectable output always low, an alternating all zeroes sequence with a user selectable output always low, an alternating all zeroes sequence with a user selectable output always high, an alternating AA sequence, and an alternating 55 sequence.

7. The system of claim 1, the test logic being configured to control the bus interface logic to selectively drive the test sequence onto one or more selected bus lines associated with the bus.

8. The system of claim 1, the first logic being a linear feedback shift register (LFSR).

9. The system of claim 8, the LFSR being configured to produce a pseudorandom test sequence based, at least in part, on a cyclic redundancy check (CRC) polynomial method.

10. The system of claim 1, the first logic being configured to produce the test sequence in real time, synchronous with one or more clock circuits providing a timing signal in the first integrated circuit.

11. The system of claim 1, the fourth logic being a linear feedback shift register (LFSR).

12. The system of claim 1, the first circuit being configured to receive a control signal operable to control one or more of, a type of test sequence to produce, a test sequence length, an initial test sequence recognition sequence, when test sequence generating will begin, a speed at which the test sequence will be driven onto the bus, and when test sequence generating will end.

13. The system of claim 1, the second circuit being configured to receive a control signal operable to control , a type of check sequence to produce, a check sequence length, an initial test sequence recognition sequence, a bus line for which testing is to be performed, an error mask to be employed, a type of miscompare data to acquire, whether a signal will be provided to an external device upon a miscompare, whether to acquire a pre-miscompare data, and whether to acquire a post-miscompare data.

14. The system of claim 1, where the first logic, the test logic, the third logic, the fourth logic, and the bus verification logic do not add a delay to a signal transmitted between the first circuit and the second circuit during non-testing operation.

15. The system of claim 1, one or more of the first circuit and the second circuit being configured to interface with IEEE 1149.1-1990 Test Access Port (TAP) instructions.

16. The system of claim 1, the first logic being configured to selectively repeat, one or more times, a selected portion of a test sequence.

17. The system of claim 16, the selected portion of the test sequence being associated with a miscompare detected by the bus verification logic.

18. The system of claim 1, the first circuit and the second circuit being fabricated into a single integrated circuit.

19. A system, comprising:
a first circuit operably connected to a bus to be electrically tested, the first circuit comprising:
a first logic configured to selectively produce a test sequence of electrical signals that may be driven onto the bus, the test sequence being selected from, a pseudorandom sequence, a walking ones sequence, a walking zeroes sequence, an alternating all ones sequence, an alternating all zeroes sequence, an alternating all ones sequence with a user selectable output always high, an alternating all ones sequence with a user selectable output always low, an alternating all zeroes sequence with a user selectable output always low, an alternating all zeroes sequence with a user selectable output always high, an alternating AA sequence, and an alternating 55 sequence, the first logic being configured to produce the test sequence in real time, synchronous with one or more clock circuits providing a timing signal in the first integrated circuit,
the first circuit being configured to receive a control signal operable to control a type of test sequence to produce, a test sequence length, an initial test sequence recognition sequence, when test sequence generating will begin, and when test sequence generating will end;
a second logic configured to produce bus protocol signals that may be driven onto the bus;
a bus interface logic operably connected to the first logic and the second logic, the bus interface logic being configured to selectively drive the test sequence and the bus protocol signals onto the bus; and
a test logic operably connected to one or more of the first logic, the second logic, and the bus interface logic, the test logic being configured to control the first circuit to select which of, the bus protocol signals, and the test sequence are driven onto the bus; and
a second circuit operably connected to the bus, the second circuit comprising:
a third logic configured to receive from the bus a received sequence of electrical signals produced by the bus interface logic driving the test sequence onto the bus;
a fourth logic configured to produce a check sequence of electrical signals related to the test sequence; and
a bus verification logic operably connected to the third logic and the fourth logic, the bus verification logic being configured to determine whether the bus is operating correctly based, at least in part, on comparing the received sequence of electrical signals and the check sequence, the bus verification logic being configured to selectively produce an external trigger upon determining that the bus is not operating correctly, the bus verification logic being configured to selectively produce a miscompare data configured to record information concerning parameters associated with determining that the bus is not operating correctly where the miscompare data comprises a bus line on which a miscompare occurred, where the miscompare data comprises a seed value employed by the fourth logic;
the second circuit being configured to receive a control signal operable to control one or more of, a type of check sequence to produce, a check sequence length, an initial test sequence recognition sequence, a bus line for which testing is to be performed, an error mask to be employed, a type of miscompare data to acquire, whether a signal will be provided to an external device upon a miscompare, whether to acquire a pre-miscompare data, and whether to acquire a post-miscompare data.

20. A method of operating a bus validation system, comprising:
controlling a driver to enter a ready state, the driver being implemented in a first circuit operably connected to a bus to be tested by the bus validation system;
controlling a receiver to enter a checking state, the receiver being implemented in a second circuit operably connected to the bus, the receiver being configured to generate a first sequence of electrical signals, controlling the receiver to enter the checking state includes providing a length of the first sequence, a type of the first sequence, a type of external trigger provided by the receiver, a type of error data collected by the receiver, a seed value that determines, at least in part, the first sequence of electrical signals, and a trigger mask that determines, at least in part, a type of bus-operation criteria examined;
controlling the driver to enter a generating state where a second sequence of electrical signals are driven onto the bus; and
electrically validating the bus based, at least in part, on the receiver comparing the first sequence to one or more electrical signals received in response to the second sequence being driven onto the bus.

21. The method of claim 20, where controlling the driver to enter the ready state includes controlling the driver to drive a benign set of electrical values onto the bus.

22. The method of claim 21, where controlling the driver to enter the generating state includes providing one or more of, a length of the second sequence, a type of the second sequence, and a seed value that determines, at least in part, the second sequence of electrical signals.

23. The method of claim 20, including selectively reporting one of, a bus passed condition, and a bus failed condition based, at least in part, on whether the bus correctly transmitted one or more digital data sequences.

24. The method of claim 20, including selectively recording a seed associated with a sequence being generated, an offset from the beginning of the sequence being generated, and data associated with one or more electrical signals in the sequence being generated.

25. The method of claim 20, where the first circuit and the second circuit are fabricated into a single integrated circuit.

26. A method of operating a bus validation system, comprising:
controlling a driver to enter a ready state, the driver being implemented in a first circuit operably connected to a bus to be tested by the bus validation system, where controlling the driver to enter the ready state includes controlling the driver to drive a benign set of electrical values onto the bus;
controlling a receiver to enter a checking state, the receiver being implemented in a second circuit operably connected to the bus, the receiver being configured to generate a first sequence of electrical signals, where controlling the receiver to enter the checking state includes providing, a length of the first sequence, a type of the first sequence, a type of external trigger provided by the receiver, a type of error data collected by the receiver, a seed value that determines, at least in part, the first sequence of electrical signals, and a trigger mask that determines, at least in part, a type of bus-operation criteria examined;

controlling the driver to enter a generating state where a second sequence of electrical signals are driven onto the bus, where controlling the driver to enter the generating state includes providing a length of the second sequence, a type of the second sequence, and a seed value that determines, at least in part, the second sequence of electrical signals;

determining whether the bus is electrically valid based, at least in part, on the receiver comparing the first sequence of electrical signals to one or more electrical signals received in response to the second sequence of electrical signals being driven onto the bus;

selectively reporting one of, a bus passed condition, and a bus failed condition; and selectively recording, a seed associated with a sequence being generated, an offset from the beginning of the sequence being generated, and data associated with one or more properties of the sequence being generated.

27. A system, comprising:

means for producing a programmatically definable first bus test pattern in a first integrated circuit;

means for placing the first bus test pattern on a bus at a clock speed approximating the clock speed at which the bus is expected to operate in production;

means for receiving in a second integrated circuit one or more electrical signals associated with the first bus test pattern being placed on the bus;

means for generating a programmatically definable second bus test pattern in the second integrated circuit; and means for determining whether the one or more received electrical signals reveal a data miscompare attributable to an undesired electrical characteristic in the bus based, at least in part, on comparing the one or more received electrical signals to the second bus test pattern, all the means being fabricated into one or more integrated circuits operably connected by the bus means for recording miscompare data comprising parameters associated with determining that the bus is not correctly transmitting digital data, where the parameters store information indicating a bus line on which a miscompare occurred and where the miscompare data comprises a seed value employed by the means for generating.

28. An electrical circuit comprising:
a bus;
a first circuit portion connected to the bus, the first circuit portion comprising:
 a first sub-circuit configured to produce a first set of electrical signals;
 a second sub-circuit configured to produce one or more bus protocol signals;
 an interface sub-circuit configured to drive the first set of electrical signals and the bus protocol signals onto the bus; and
 a third sub-circuit operably connected to one or more of, the first sub-circuit, the second sub-circuit, and the interface sub-circuit, the third sub-circuit being configured to control the first circuit portion to selectively disable driving the bus protocol signals onto the bus and to selectively enable driving the first set of electrical signals onto the bus; and a second circuit portion connected to the bus, the second circuit portion comprising:
 a fourth sub-circuit configured to receive one or more electrical signals produced by driving the first set of electrical signals onto the bus;
 a fifth sub-circuit configured to produce a second set of electrical signals identical to the first set of electrical signals; and
 a sixth sub-circuit operably connected to the fourth sub-circuit and the fifth sub-circuit, the sixth sub-circuit being configured to determine whether the bus is correctly transmitting data based, at least in part, on comparing the one or more received electrical signals and the second set of electrical signals, where the sixth sub-circuit is to record miscompare data comprising parameters associated with determining in real-time that the bus is not correctly transmitting digital data, the parameters store information indicating a bus line on which a miscompare occurred the miscompare data further comprising a seed value used for determining a sequence of the received one or more electrical signals.

29. The electrical circuit of claim 28, the sixth sub-circuit being configured to selectively produce, upon determining that the bus is not correctly transmitting data, an external trigger, and to selectively record information concerning one or more of, the first set of electrical signals, and the second set of electrical signals.

30. The electrical circuit of claim 28, the first circuit portion, the second circuit portion, and the bus being fabricated into a single integrated circuit.

31. The electrical circuit of claim 28, the first circuit portion and the second circuit portion being fabricated into two separate integrated circuits.

32. A computer configured with the electrical circuit of claim 29.

33. A printer configured with the electrical circuit of claim 29.

34. A bus validation system, comprising:
an integrated circuit operably connectable to a bus, the bus being connectable to an external device configured to drive one or more electrical signals onto the bus, the integrated circuit comprising:
 a first logic configured to receive a test sequence of electrical signals from the bus;
 a second logic configured to produce a check sequence of electrical signals related to the test sequence of electrical signals; and
 a compare logic operably connected to the first logic and the second logic, the compare logic being configured to determine whether the bus is correctly transmitting data based, at least in part, on comparing the test sequence and the check sequence where the compare logic is to cause a miscompare data to be recorded,
 the miscompare data comprising parameters associated with determining that the bus is not correctly transmitting digital data, the parameters store information indicating a bus line on which a miscompare occurred the miscompare data further comprising a seed value employed by the second logic.

35. The bus validation system of claim 34, the compare logic being configured to selectively produce an external trigger upon determining that the bus is not correctly transmitting digital data.

36. The bus validation system of claim 35, the compare logic being configured to selectively produce an error data configured to record information concerning one or more parameters associated with determining that the bus is not correctly transmitting digital data.

37. A system, comprising:
- a first logic configured to selectively produce a test sequence of electrical signals that may be driven onto a bus;
- a second logic configured to produce one or more bus protocol signals that may be driven onto the bus;
- a bus interface logic operably connected to the first logic and the second logic, the bus interface logic being configured to drive the test sequence of electrical signals and the bus protocol signals onto the bus;
- a test logic operably connected to one or more of the first logic, the second logic, and the bus interface logic, the test logic being configured to selectively control which of the bus protocol signals and the test sequence of electrical signals are driven onto the bus;
- a third logic configured to receive from the bus a received sequence of electrical sequences produced by driving the test sequence of electrical signals onto the bus;
- a fourth logic configured to produce a check sequence of electrical signals related to the test sequence of electrical signals; and
- a bus verification logic operably connected to the third logic and the fourth logic, the bus verification logic being configured to determine whether the bus is correctly transmitting digital data based, at least in part, on comparing the received sequence and the check sequence, where the bus verification logic is to record miscompare data comprising parameters associated with determining that the bus is not correctly transmitting digital data, the parameters store information indicating a bus line on which a miscompare occurred the miscompare data further comprising a seed value employed by the fourth logic.

38. The system of claim 37, the bus verification logic being configured to selectively produce an external trigger upon determining that the bus is not correctly transmitting digital data.

39. The system of claim 38, the bus verification logic being configured to selectively produce a miscompare data configured to record information concerning one or more parameters associated with determining that the bus is not correctly transmitting digital data.

* * * * *

UNITED STATES PATENT AND TRADEMARK OFFICE
CERTIFICATE OF CORRECTION

PATENT NO. : 7,610,526 B2  Page 1 of 1
APPLICATION NO. : 11/041821
DATED : October 27, 2009
INVENTOR(S) : Sherlock et al.

It is certified that error appears in the above-identified patent and that said Letters Patent is hereby corrected as shown below:

In column 16, line 52, in Claim 13, delete "control ," and insert -- control, --, therefor.

In column 19, line 2, in Claim 26, delete "providing ," and insert -- providing --, therefor.

In column 19, line 23, in Claim 26, delete "recording," and insert -- recording --, therefor.

In column 19, line 44, in Claim 27, after "bus" insert -- ; --.

In column 20, line 21, in Claim 28, delete "occurred" and insert -- occurred, --, therefor.

In column 20, line 59, in Claim 34, delete "occurred" and insert -- occurred, --, therefor.

In column 22, line 10, in Claim 37, delete "occurred" and insert -- occurred, --, therefor.

Signed and Sealed this

Sixteenth Day of February, 2010

David J. Kappos
*Director of the United States Patent and Trademark Office*